United States Patent
Kitahara et al.

(10) Patent No.: US 7,023,681 B2
(45) Date of Patent: Apr. 4, 2006

(54) SOLID-STATE RELAY

(75) Inventors: Yasuyuki Kitahara, Takeo (JP); Yasuo Hayashi, Imari (JP)

(73) Assignee: Omron Corporation, Kyoto (JP)

( * ) Notice: Subject to any disclaimer, the term of this patent is extended or adjusted under 35 U.S.C. 154(b) by 327 days.

(21) Appl. No.: 10/383,878

(22) Filed: Mar. 10, 2003

(65) Prior Publication Data
US 2003/0231444 A1 Dec. 18, 2003

(30) Foreign Application Priority Data
Mar. 15, 2002 (JP) ............................. 2002-072728

(51) Int. Cl.
*H02H 9/00* (2006.01)

(52) U.S. Cl. ..................................... 361/118

(58) Field of Classification Search ............... 361/118, 361/93.1, 100, 18, 56, 115
See application file for complete search history.

(56) References Cited

U.S. PATENT DOCUMENTS 4,395,637 A 7/1983 Hamamsy
4,970,623 A * 11/1990 Pintar ........................ 361/187

FOREIGN PATENT DOCUMENTS

| DE | 32 10 850 A1 | 10/1982 |
| DE | 33 11 667 A1 | 10/1984 |
| EP | 0 073 461 A2 | 3/1983 |
| WO | WO 98/59420 A1 | 12/1998 |

* cited by examiner

*Primary Examiner*—Stephen W. Jackson
(74) *Attorney, Agent, or Firm*—Foley & Lardner LLP

(57) ABSTRACT

A solid-state relay is arranged so that, during the off-state of the switching element, a surge protective means forcefully turns the switching element on based upon a surge voltage VSG multiplexed on an AC voltage VAC from output terminals; therefore, a surge current is allowed to flow by the low impedance (on-resistance) of the switching element so that the surge voltage VSG is absorbed to be set to a low surge voltage VSG, thereby making it possible to protect the switching element from damages caused by the surge voltage VSG.

6 Claims, 4 Drawing Sheets

SOLID-STATE RELAY

BACKGROUND OF THE INVENTION

1. Field of the Invention

The present invention relates to a solid-state relay (SSR) for protecting a switching element from a lightning surge, and, more specifically, concerns a solid-state relay (SSR) which, in the event of a lightning surge during an off-state of the switching element, protects the switching element by forcefully turning the switching element on.

2. Description of the Background Art

With respect to conventional solid-state relays (SSR), the following arrangement has been proposed: a surge absorbing element (for example, a surge absorber) is parallel-connected to the load-connecting side of a switching element so that the surge voltage of a multiplexed lightning surge from the load side is limited to a value lower than the maximum rated voltage of the switching element so as to protect the switching element.

FIG. 4 shows a block diagram that indicates one example of an essential portion of a conventional solid-state relay. In FIG. 4, a solid-state relay (SSR) 50 is provided with an input circuit 2, a photo-coupler 3, a resistor R1, a thyristor 4 and a surge absorber 5, and in this arrangement, a DC power supply VDC (or an AC power supply Vac) is applied between input terminals I1 and I2, and a load LD is connected to output terminals O1 and O2 with an AC power supply VAC being applied to the load LD. Here, the load LD is constituted by a resistor, a lamp, a valve, an electromagnetic clutch, etc.

The input circuit 2 is constituted by control circuits such as sequencers, and a control signal for controlling on-off states of the thyristor 4 serving as a switching element is supplied to a light-emitting diode of the photo-coupler 3 so as to allow an AC current to flow through the load LD or to stop it.

The photo-coupler 3 is formed by a photo-thyristor that is bi-directionally connected to the light-emitting diode, and when a control signal (for example, a DC current) is supplied from the input circuit 2, the light-emitting diode emits light so that, upon receipt of the light, the photo-thyristor is turned on with an AC current flowing through the resistor R1 and a resistor R2 of the thyristor 4.

The thyristor 4 is formed by a triac that is a bi-directional AC switch; thus, when the voltage drop of the resistor R2 (gate voltage) has reached a predetermined value, the triac is turned on bi-directionally, and in contrast, when the voltage drop of the resistor R2 (gate voltage) goes below a holding voltage, the triac is turned off to form a switching element.

When an AC current flows through the resistor R2 to cause a predetermined voltage drop, the thyristor 4 is turned on so that the output terminals O1 and O2 are short-circuited by a low impedance of the thyristor 4 to allow the AC current to flow through the load LD, thereby driving the load LD.

When the control signal (for example, a DC current) from the input circuit 2 is stopped, the photo-coupler 3 is turned off so that the thyristor 4 is also turned off to open the output terminals O1 and O2; thus, the AC current is blocked and the driving operation of the load LD is stopped.

Here, a bidirectional photo-thyristor is used as the photo-coupler 3 and a bi-directional triac is used as the thyristor 4 so that it is possible to switch an AC current having its polarity changed every half cycles. Moreover, the application of the photo-coupler 3 insulates the DC current on the input circuit 2 side from the AC current on the thyristor 4 side so as to separate these from each other.

The surge absorber 5 is parallel-connected to the thyristor 4, and placed on the output terminals O1 and O2 side; thus, in the case when a lightning surge that is induced by a transmission line and multiplexed on an AC power supply VAC is generated in the output terminals O1 and O2 through the load LD, this is determined by a surge resistant amount, and limited (surge-absorbed) to a surge voltage lower than the maximum rated voltage of the thyristor 4 so as to protect the thyristor 4 from the lightning surge.

FIG. 5 shows a block diagram indicating an essential portion of another example of a conventional solid-state relay. In FIG. 5, a solid-state relay (SSR) 60 is provided with an input circuit 2, a PD (photodiode) array coupler 9, a resistor R3, an MOS-type FET (electric field-effect transistor) 10 having n-channels and a surge absorber 5, and in this arrangement, a DC power supply VDC (or an AC power supply VAC) is applied between input terminals I1 and I2, and a load LD is connected to output terminals O1 and O2 with an AC power supply VAC being applied to the load LD.

The input circuit 2 is constituted by control circuits such as sequencers, and a control signal for controlling on-off states of the series-connected FET 10 (Q1 and Q2) serving as a switching element is supplied to a light-emitting diode of the PD (photodiode) array coupler 9 so as to allow an AC current to flow through the load LD or to stop it.

The PD (photodiode) array coupler 9 is constituted by n-number of photodiodes that are series-connected to the light-emitting diode, and when a control signal (for example, a DC current) is supplied from the input circuit 2, the light-emitting diode emits light, and upon receipt of the light, the n-number of photodiodes generate a predetermined voltage n×VD (VD represents a forward-direction voltage of the diode: approximately 0.6 V) so that a current is allowed to flow the resistor R3 with a bias voltage VGS being applied between the gate G and source S of the FET 10 (Q1 and Q2).

The FET 10, which is constituted by the FET Q1 and FET Q2 that are MOS-type FETs having n-number of channels, and series-connected to each other, is turned on by the bias voltage VGS (=n×VD) supplied from the n-number of photodiodes of PD (photodiode) array coupler 9 so that the output terminals O1 and O2 are short-circuited by a low impedance at the time of the on-states of the FET Q1 and FET Q2; thus, an AC current is allowed to flow through the load LD to drive the load LD.

When the control signal (for example, a DC current) from the input circuit 2 is stopped, the FET 10 is set to the off-state without the bias voltage VGS (=n×VD) supplied from the n-number of photodiodes of the PD (photodiode) array coupler 9 so that the connection between the output terminals O1 and O2 are opened to block the AC current, thereby stopping the driving operation of the load LD. In this manner, the FET 10 forms a bi-directional switching element for the AC power supply VAC.

Here, the n-number of photodiodes are used in the PD (photodiode) array coupler 9 and the FET 10 is used as the switching element so that it is possible to switch an AC current having its polarity changed every half cycles. Moreover, the application of the PD (photodiode) array coupler 9 makes it possible to insulate the DC current on the input circuit 2 side from the AC current on the thyristor 4 side so as to separate these from each other.

The surge absorber 5 is parallel-connected to the FET 10 and placed on the output terminals O1 and O2 side, and in the case when a lightning surge that is induced by a transmission line and multiplexed on an AC power supply VAC is generated in the output terminals O1 and O2 through the load LD, is determined by a surge resistant amount, and limited (surge-absorbed) to a surge voltage lower than the maximum rated voltage of the FET 10 so as to protect the FET 10 from the lightning surge.

With respect to the conventional solid-state relays (SSR) 50, 60, in the case when the maximum rated voltage of the switching element constituted by the thyristor 4, the FET (electric field effect transistor) 10 or the like is set to a value higher than the surge resistant amount (surge clamp voltage) of the surge absorber 5 with the lighting surge (surge voltage) to be multiplexed on the AC power supply VAC being set to a comparatively low level, it is possible to protect the switching element; however, in the case when the lightning surge (surge voltage) to be multiplexed is great, the surge absorber 5 fails to absorb this, with the result that the surge voltage to be applied to the switching element exceeds the maximum rated voltage of the switching element, and tends to damage the switching element.

The damage to the switching element to be caused by the lightning surge can be prevented by adopting a surge absorber 5 having a greater surge resistant amount (having a low surge cramp voltage with a great absorbing capacity) or a switching element (thyristor 4, FET 10) having a greater maximum rated voltage; however, large-size surge absorber and switching element are required, consequently resulting in high costs.

Here, it has been known that the influences of lightning surge are very small (causes no damage) when the switching element is in the on-state, and very serious when the switching element is in the off-state (causes damages).

BRIEF SUMMARY OF THE INVENTION

The present invention has been devised to solve the problems, and its objective is to provide a solid-state relay (SSR) which can positively protect a switching element from damages caused by lightning surge by using a simple structure.

In order to achieve the above-mentioned objective, a solid-state relay, which has a switching element for controlling an on-state (conductive state) and an off-state (non-conductive state) of an electric current flowing through an external load based upon a control signal that is supplied from an input circuit, is provided with a surge protective means which, in the case when a multiplexed surge is applied from the load side during an off-state of the switching element, forcefully turns the switching element on based upon the lightning surge.

The solid-state relay in accordance with the present invention, which has a switching element for controlling an on-state (conductive state) and an off-state (non-conductive state) of an electric current flowing through an external load based upon a control signal that is supplied from an input circuit, is provided with a surge protective means which, in the case when a multiplexed lightning surge is applied from the load side during an off-state of the lightning switching element, forcefully turns the switching element on based upon the surge so that, in response to a lightning surge, it is possible to forcefully set the switching element in the on-state to lower the impedance of the switching element, and also to positively protect the switching element from lightning surge by using the surge protective means having a simple structure.

Moreover, the surge protective means in accordance with the present invention is provided with a surge-absorbing element.

Furthermore, the surge protective means in accordance with the present invention is provided with a constant-voltage element.

Since the surge protective means relating to the present invention is provided with a surge-absorbing element or a constant-voltage element, it is possible to apply a bias voltage to the switching element by operating the surge-absorbing element or the constant-voltage element to allow a current to flow in response to a multiplexed lightning surge, and consequently to forcefully turn the switching element on from the off-state to lower the impedance of the switching element.

DESCRIPTION OF THE PREFERRED EMBODIMENTS

Referring to Figures, the following description will discuss embodiments of the present invention. In the present invention, in the case when a lightning surge is multiplexed on an AC current power supply with the switching element of the solid-state relay (SSR) being in the off-state, the surge protective means forcefully turns the switching element on by utilizing the lightning surge voltage to lower the impedance of the switching element, thereby making it possible to protect the switching element from the lightening surge.

Figure 1:
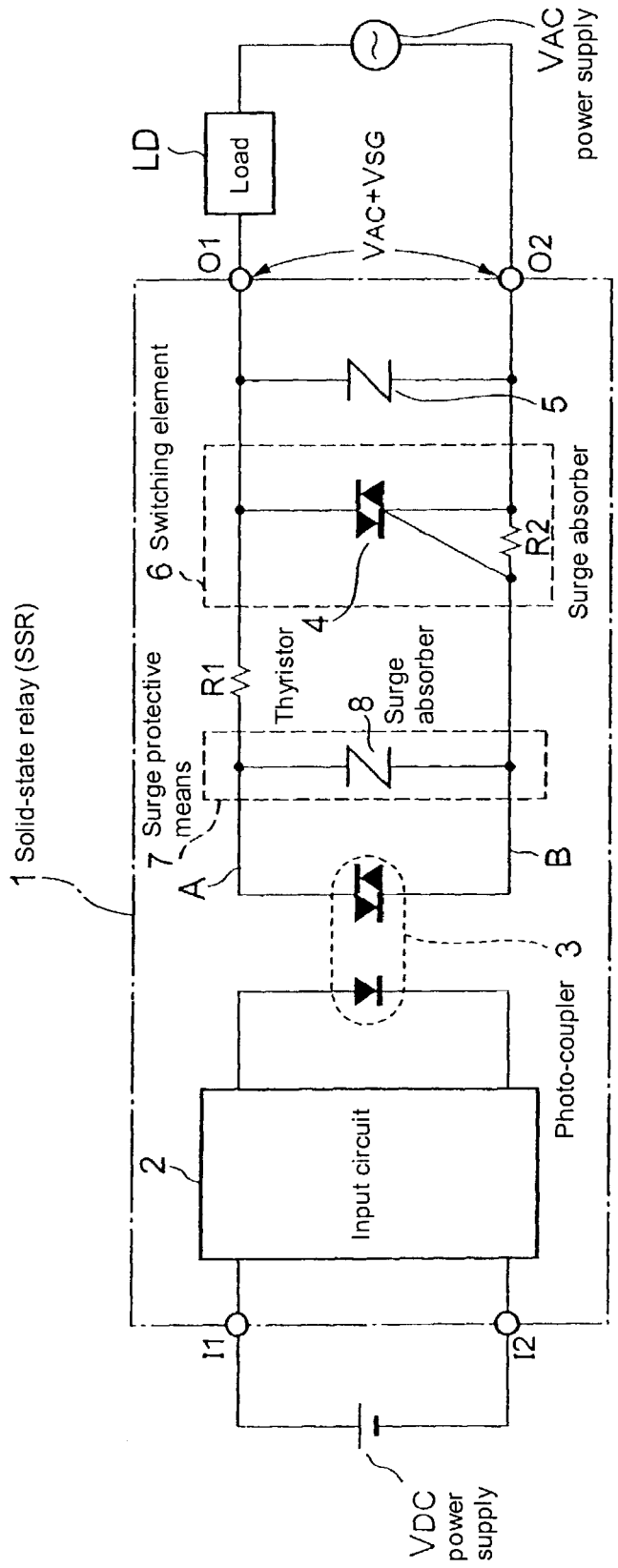
FIG. 1 shows a structural drawing that indicates one embodiment of a solid-state relay (SSR) in accordance with the present invention.
Figure 4:
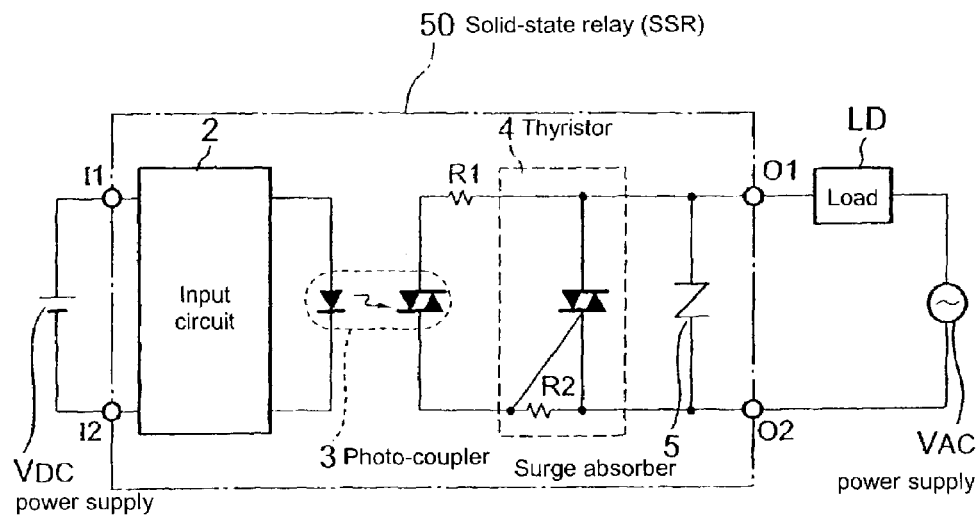
FIG. 4 shows a block diagram that indicates one example of an essential portion of a conventional solid-state relay.

FIG. 1 shows a structural drawing that indicates one embodiment of a solid-state relay (SSR) in accordance with the present invention. In FIG. 1, a solid-state relay (SSR) 1 is provided with an input circuit 2, a photo-coupler 3, a resistor R1, a surge absorber 5, a switching element 6, a surge preventive means 7, input terminals I1, I2, and output terminals O1, O2, and an external DC power supply VDC (or an AC power supply Vac) is connected to the input terminals I1, I2, and an external load LD and AC power supply VAC are connected to the output terminals O1, O2. Here, in FIG. 1, those portions (blocks and elements) that are the same as those of FIG. 4 are indicated by the same reference numerals. Moreover, the explanation of the basic operations for allowing a current to flow through the load LD of the solid-state relay (SSR) 1 and for stopping the current is omitted since it has been discussed by reference to FIG. 4, and the following description will discuss related operations for protecting the switching element 6 from a lightning surge that is multiplexed on an AC power supply VAC.

The switching element 6 is formed by a thyristor 4 (for example, a triac) serving as a bi-directional switch, and when a current (for example, one portion of a surge current)

caused by a lightning surge (surge voltage VSG) is allowed to flow through the resister R2 so that when the voltage drop of the resistor 2 has reached a predetermined gate voltage, it is set to the on-state, causing a reduction in the impedance (on-resistance) across the two ends of the thyristor 4, and short-circuiting the output terminals O1 and O2 to which the thyristor 4 is connected, by a low impedance.

When the lightning surge (surge voltage VSG) is stopped so that no current (portion of the surge current) is allowed to flow through the resistor R2, the gate voltage disappears, setting the thyristor 4 in the off-state.

The surge protective means 7 is constituted by a surge-absorbing element such as a surge absorber 8, and at the off-time of the switching element 6, a lightning surge (surge voltage VSA), multiplexed on an ac voltage VAC, is determined by the surge absorber 5 interpolated between the output terminals O1, O2 so that the limited surge voltage is applied between point A and point B through the register R1.

When the surge voltage applied between point A and point B exceeds the surge-absorbing voltage of the surge absorber 8, the surge protective means 7 (surge absorber 8) allows a current (one portion of the surge current) to flow through a passage of the output terminal O1→the resistor R1→the surge protective means 7 (surge absorber 8)→the resistor R2→the output terminal O2 (or a passage of the output terminal O2→the resistor R2→the surge protective means 7 (surge absorber 8)→the resistor R1→the output terminal O1).

Upon short-circuiting (low impedance) of the switching element 6, the surge voltage VSG (VAC+VSG), multiplexed on the AC voltage VAC, which is applied between the output terminals O1 and O2, allows a greater current (AC current+surge current) to flow through the switching element 6 so that the surge voltage VSG is absorbed by the switching element 6, and reduced.

Here, in the on-state of the switching element 6, the surge protective means 7 is operated by the surge voltage VSG (more specifically, AC voltage VAC+surge voltage VSG) to allow a current (one portion of surge current) to flow, and this state continues as long as the gate voltage of the thyristor 4 is maintained at a predetermined value (a voltage required for turning-on); however, since the continuous time of the surge voltage VSG is very short, no influences are actually caused even when the current flows through the load LG during the on-period of the switching element 6.

As described above, the solid-state relay (SSR) 1 is arranged so that, during the off-state of the switching element 6, the surge protective means 7 forcefully turns the switching element 6 on, based upon the surge voltage VSG multiplexed on the AC voltage VAC from the output terminals O1, O2; therefore, the surge current is allowed to flow by the low impedance (on-resistance) of the switching element 6 so that the surge voltage VSG is absorbed to be set to a low surge voltage VSG, thereby making it possible to protect the switching element 6 from damages caused by the surge voltage VSG.

Moreover, since the surge protective means 7 is provided with the surge-absorbing element (surge absorber 8), the surge-absorbing element (surge absorber 8) is operated to allow a current to flow upon receipt of a multiplexed lightning surge so that a bias voltage is applied to the switching element (thyristor 4); thus, the switching element (thyristor 4), which is in the off-state, is forcefully turned on so as to reduce the impedance of the switching element.

Figure 2:
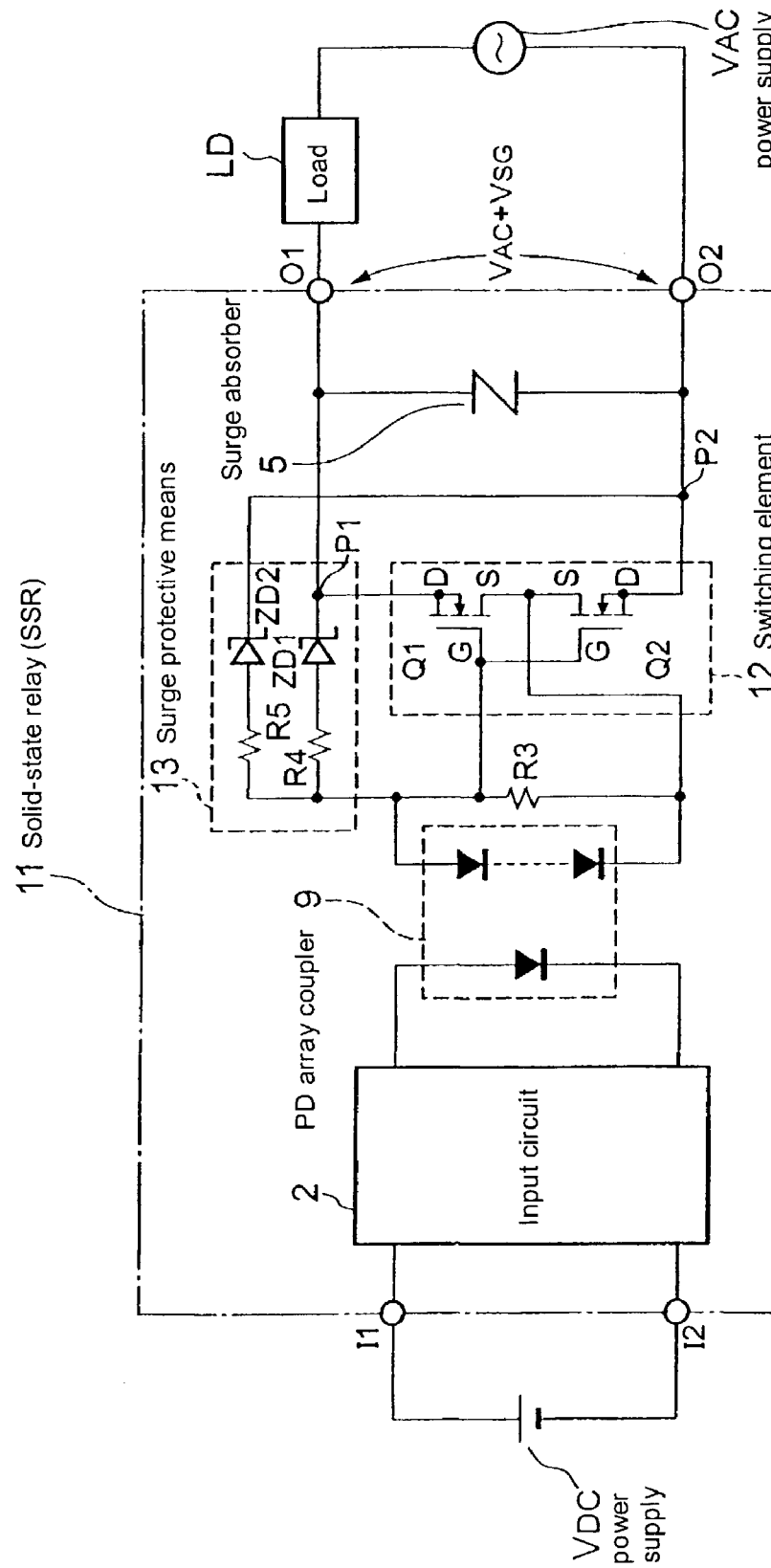
FIG. 2 shows a structure of another embodiment of a solid-state relay (SSR) in accordance with the present invention.
Figure 5:
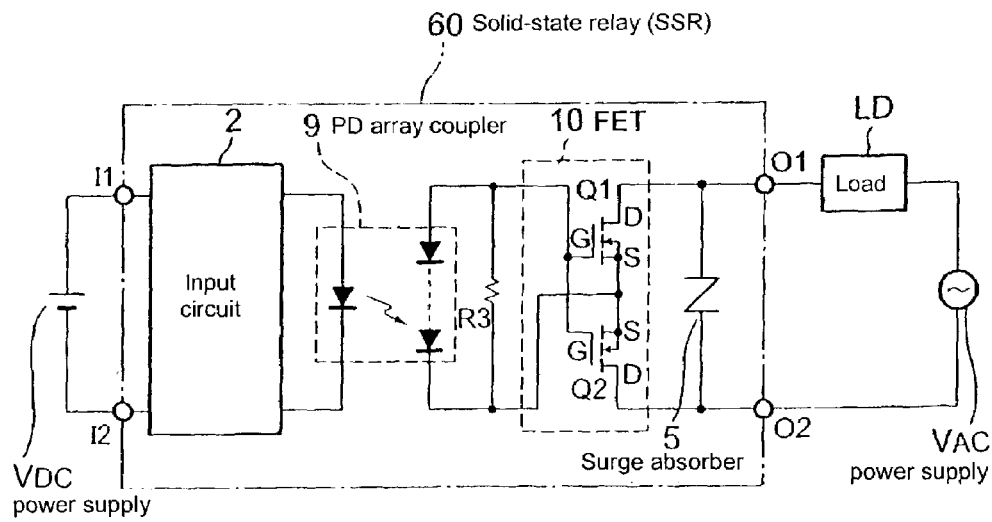
FIG. 5 shows a block diagram that indicates another example of an essential portion of a conventional solid-state relay.

FIG. 2 shows a structure of another embodiment of a solid-state relay (SSR) in accordance with the present invention. In FIG. 2, a solid-state relay (SSR) 11 is provided with an input circuit 2, a PD (photodiode) array coupler 9, a resistor R3, a surge absorber 5, a switching element 12, a surge preventive means 13, input terminals I1, I2, and output terminals O1, O2, and an external DC power supply VDC (or an AC power supply Vac) is connected to the input terminals I1, I2, and an external load LD and AC power supply VAC are connected to the output terminals O1, O2. Here, in FIG. 2, those members (blocks and elements) that are the same as those of FIG. 5 are indicated by the same reference numerals. Moreover, the explanation of the basic operations for allowing a current to flow through the load LD of the solid-state relay (SSR) 11 and for stopping the current is omitted since it has been discussed by reference to FIG. 5, and the following description will discuss related operations for protecting the switching element 12 from a lightning surge that is multiplexed on an AC power supply VAC.

The switching element 12 is formed by series-connecting MOS-type FETs Q1 and Q2 having n-channels, and in the case when, during the off-time (FETs Q1 and Q2 are off) of the switching element 12, a lightning surge (surge voltage VSG) is multiplexed on an AC power supply VAC from the output terminals O1, O2 (AC power supply VAC+surge voltage VSG), a current (one portion of a surge current) caused by the surge voltage VSG is allowed to flow through the surge protective means 13 so that a predetermined voltage n×VD (VD is a forward direction voltage of the diode: approximately 0.6 V) is generated in the n-number of photodiodes that are series-connected to the PD (photodiode) array coupler 9; thus, a current is allowed to flow through the resistor R3, while a bias voltage VGS is applied between gate G and source S of the FET Q1 and FET Q2 so that the FETs Q1 and Q2 are turned on, thereby short-circuiting the output terminals O1 and O2 to which the FETs Q1 and Q2 are connected by using a low impedance derived from the on-resistance of the FET Q1 and Q2.

When the lightning surge (surge voltage VSG) is stopped so that no current (portion of the surge current) is allowed to flow through the surge protective means 13, the bias voltage VGS between the gate G and source S of the FET Q1 and FET Q2 disappears, setting the switching element 12 in the off-state.

In the surge protective means 13, a constant-voltage element, such as a Zener diode ZD1, and a resistor R4 are series-connected, and this is connected between point P1 and the upper anodes of the n-number of series-connected photodiodes of the PD (photodiode) array coupler 9, while a constant-voltage element, such as a Zener diode ZD2, and a resistor R5 are series-connected, and this is connected between point P2 and the upper anodes of the n-number of series-connected photodiodes of the PD (photodiode) array coupler 9.

Here, the combination of the Zener diode ZD1 and the resistor R4 is operated with respect to a surge voltage VSG that is multiplexed on the output terminal O1 side, while the combination of the Zener diode ZD2 and the resistor R5 is operated with respect to a surge voltage VSG that is multiplexed on the output terminal O2 side.

When the surge voltage VSG exceeds a Zener voltage VZ of the Zener diode ZD1 or the Zener diode ZD2, the surge protective means 13 supplies a current (one portion of surge current) to the upper anodes of the n-number of series-connected photodiodes of the PD (photodiode) array coupler 9 through the resistor R4 or the resistor R5.

When a current (one portion of surge current) is supplied to the upper anodes of n-number of photodiodes, a bias voltage VGS having a predetermined voltage n×VD (VD is a forward direction voltage of the diode: approximately 0.6 V) is generated in the n-number of photodiodes so that the bias voltage VGS is applied between the gate G and source S of the FET Q1 and FET Q2 of the switching element 12 so that the FET Q1 and FET Q2 are set to the on-state, thereby short-circuiting the output terminals O1 and O2 by a low impedance (on-resistance) of the FET Q1 and FET Q2.

Upon short-circuiting (low impedance) the switching element 12, the surge voltage VSG (VAC+VSG), multiplexed on an AC voltage VAC applied between the output terminals O1 and O2, allows a great current (AC current+surge current) to flow through the FET Q1 and FET Q2 so that the surge voltage VSG is absorbed by the switching element 12, and reduced.

Here, the on-state of the switching element 12 continues, as long as the surge protective means 13 is operated by the surge voltage VSG (more specifically, AC voltage VAC+ surge voltage VSG) so that a current (one portion of surge current) is allowed to flow with the bias voltage VGS of the FET Q1 and FET Q2 being maintained at a predetermined value (a voltage required for turning-on); however, since the continuous time of the surge voltage VSG is very short, no influences are actually caused even when the current flows through the load LG during the on-period of the switching element 12.

As described above, the solid-state relay (SSR) 11 is arranged so that, during the off-state of the switching element 12, the surge protective means 13 forcefully turns the switching element 12 on, based upon the surge voltage VSG multiplexed on the AC voltage VAC from the output terminals O1, O2; therefore, the surge current is allowed to flow by the low impedance (on-resistance) of the switching element 12 so that the surge voltage VSG is absorbed to be set to a low surge voltage VSG, thereby making it possible to protect the switching element 12 from damages caused by the surge voltage VSG.

Moreover, since the surge protective means 13 is provided with the constant-voltage elements ZD1, ZD2, the constant-voltage elements ZD1, ZD2 are operated to allow a current to flow upon receipt of a multiplexed lightning surge so that a bias voltage is applied to the switching element 12 (FET Q1 and FET Q2); thus, the switching element 12, which is in the off-state, is forcefully turned on so as to reduce the impedance of the switching element 12.

Figure 3A:
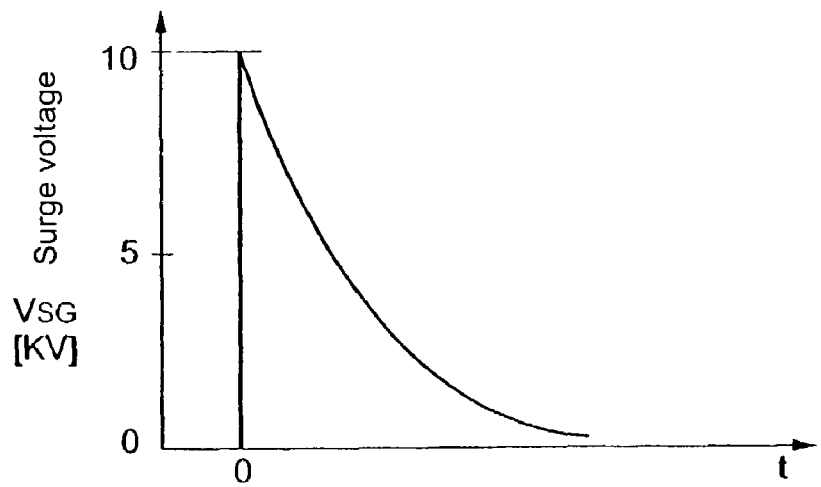
FIGS. 3A, 3B, and 3C show an applied waveform diagram of a surge voltage (VSG) of a lightning surge.

FIG. 3 shows an applied waveform diagram of a surge voltage (VSG) of a lightning surge. FIG. 3A shows a waveform diagram that indicates a case in which, without the surge absorber 5, the surge protective means 7 (see FIG. 1) and the surge protective means 13 (see FIG. 2), a surge voltage VSG of 10 kV is applied from a lightning surge tester.

Figure 3B:
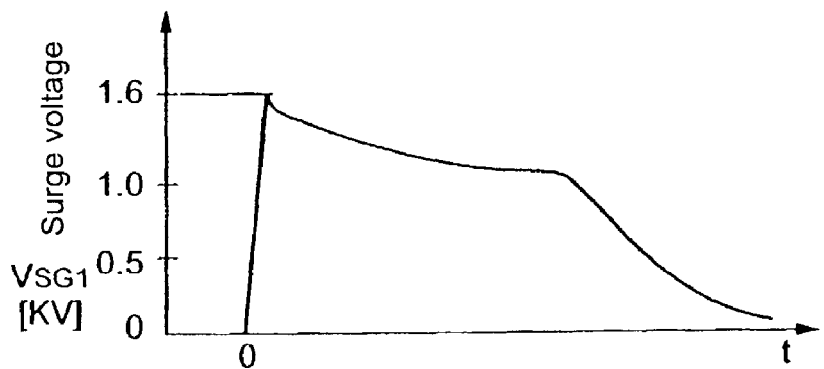

FIG. 3B shows a case in which, when the surge absorber 5 is inserted as shown in FIG. 1 or FIG. 2, the surge voltage VSG (10 kV) of FIG. 3A is absorbed by the surge absorber 5 so that the surge-absorbing effect for forming a reduced surge voltage VSG1 is exerted.

Figure 3C:
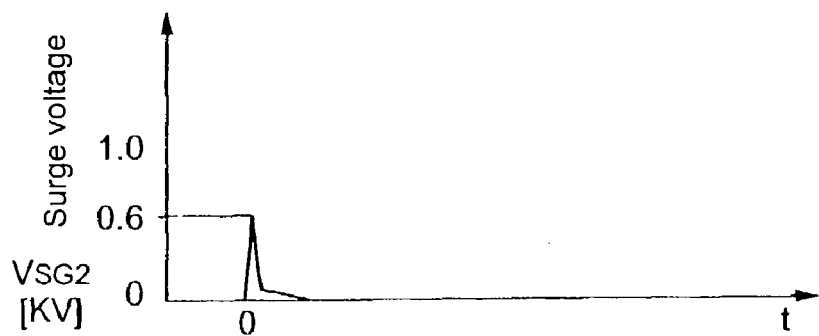

FIG. 3C shows a case in which, when the surge protective means 7 is inserted as shown in FIG. 1 or when the surge protective means 13 is inserted as shown in FIG. 2, in addition to the surge absorber 5 of FIG. 3B, the surge voltage VSG (10 kV) of FIG. 3A is absorbed by the surge absorber 5 and the surge protective means 7 (or the surge protective means 13) so that the surge absorbing effect for forming a reduced surge voltage VSG2 is exerted.

It has been confirmed that even when a surge voltage VSG of 20 kV is applied to the solid-state relay (SSR) 1 and 11 shown in FIGS. 1 and 2, it is possible to carry out an appropriate protection process.

As described above, the solid-state relay in accordance with the present invention, which has a switching element for controlling an on-state (conductive state) and an off-state (non-conductive state) of an electric current flowing through an external load based upon a control signal that is supplied from an input circuit, is provided with a surge protective means which, in the case when a multiplexed lightning surge is applied from the load side during an off-state of the switching element, forcefully turns the switching element on based upon the lightning surge so that, in response to a lightning surge, it is possible to forcefully set the switching element in the on-state to lower the impedance of the switching element, and also to positively protect the switching element from lightning surge by using the surge protective means having a simple structure.

Moreover, since the surge protective means relating to the present invention is provided with a surge-absorbing element or a constant-voltage element, it is possible to apply a bias voltage to the switching element by operating the surge-absorbing element or the constant-voltage element to allow a current to flow in response to a multiplexed lightning surge, and consequently to forcefully turn the switching element on from the off-state to lower the impedance of the switching element.

What is claimed is:

1. A solid-state relay, comprising:
    a switching element configured to control an on-state (conductive state) and an off-state (non-conductive state) of an electric current flowing through an external load on a load side of the relay based upon a control signal that is supplied from an input circuit; and
    surge protective means for, in the case when a multiplexed surge is applied from said load side during an off-state of said switching element, forcefully turning on said switching element based upon the surge.

2. The solid-state relay according to claim 1, wherein said surge protective means comprises a surge absorbing element.

3. The solid-state relay according to claim 1, wherein said surge protective means comprises a constant-voltage element.

4. A solid-state relay, comprising:
    a switching element configured to control an on-state (conductive state) and an off-state (non-conductive state) of an electric current flowing through an external load on a load side of the relay based upon a control signal that is supplied from an input circuit; and
    a surge protector which, in the case when a multiplexed surge is applied from said load side during an off-state of said switching element, forcefully turns on said switching element based upon the surge.

5. The solid-state relay according to claim 4, wherein said surge protector comprises a surge absorbing element.

6. The solid-state relay according to claim 4, wherein said surge protector comprises a constant-voltage element.

* * * * *